US008647922B2

(12) United States Patent
Zhou et al.

(10) Patent No.: US 8,647,922 B2
(45) Date of Patent: Feb. 11, 2014

(54) METHOD OF FORMING AN INTERCONNECT ON A SEMICONDUCTOR SUBSTRATE

(75) Inventors: Jijie Zhou, Shanghai (CN); Zhong Chen, Singapore (SG)

(73) Assignee: Nanyang Technological University, Singapore (SG)

( * ) Notice: Subject to any disclaimer, the term of this patent is extended or adjusted under 35 U.S.C. 154(b) by 1204 days.

(21) Appl. No.: 11/937,210

(22) Filed: Nov. 8, 2007

(65) Prior Publication Data

US 2009/0239338 A1    Sep. 24, 2009

(51) Int. Cl.
*H01L 21/50* (2006.01)
*H01L 21/60* (2006.01)

(52) U.S. Cl.
USPC .............. 438/108; 257/E29.001; 257/E51.04; 438/478; 977/796; 977/932

(58) Field of Classification Search
USPC .............. 438/478, 108; 24/442–452; 977/796, 977/932, E29.001, E51.04
IPC ..................................................... H01L 21/208
See application file for complete search history.

(56) References Cited

U.S. PATENT DOCUMENTS

| | | | | |
|---|---|---|---|---|
| 6,297,063 | B1 * | 10/2001 | Brown et al. | 438/2 |
| 6,989,325 | B2 | 1/2006 | Uang et al. | |
| 7,181,811 | B1 * | 2/2007 | Tomanek et al. | 24/442 |
| 2004/0250950 | A1 * | 12/2004 | Dubrow | 156/276 |
| 2005/0048697 | A1 * | 3/2005 | Uang et al. | 438/108 |
| 2006/0088848 | A1 * | 4/2006 | Noca et al. | 435/6 |
| 2006/0192475 | A1 * | 8/2006 | Lee et al. | 313/495 |
| 2007/0114120 | A1 | 5/2007 | Konesky | |
| 2007/0134866 | A1 * | 6/2007 | Huang et al. | 438/199 |

FOREIGN PATENT DOCUMENTS

| WO | WO/2006/048846 | 5/2006 |
|---|---|---|
| WO | WO/2006/048847 | 5/2006 |

OTHER PUBLICATIONS

Alemany et al. *Nano Letters* 7(7) :1878-1882 (2007).
Autumn, K., et al, *Proc. Natl. Acad. Sci. U.S.A.* (2002) 99, 19, 12252-12256.
Bryning, M.B., et al., *Advanced Materials* (2007) 19, 661-664.
Ericson, L.M., & Pehrsson, P.E., *J. Phys. Chem* (2005) 109, 20276-20280.
Flatt, A.K., et al. *J. Am. Chem. Soc* (2005) 127, 8918-8919.
Hall, A.R., et al. *Nature Nanotechnology* (2007) doi: 10.1038/ nnano.2007.179.
Ishigami, M., et al., *Scanning Tunneling Microscopy/Spectroscopy and Related Techniques: 12th Internat. Conference, CP696* [2003], edited by P. M. Koenraad and M. Kemerink, 94-99.

(Continued)

*Primary Examiner* — Peniel M Gumedzoe
(74) *Attorney, Agent, or Firm* — Cahn & Samuels, LLP (57) ABSTRACT

The present invention relates to a method of forming a wire bond-free conductive interconnect area on a semiconductor substrate. A semiconductor substrate with an electrically conductive protrusion, defining a bond pad, is provided as well as a plurality of carbon nanotubes. The plurality of carbon nanotubes is immobilized on the bond pad by allowing at least one random portion along the length of the carbon nanotubes to attach to the surface of the bond pad. Thus an aggregate of loops of carbon nanotubes is formed on the surface of the bond pad. Thereby a conductive interconnect area is formed on the electrically conductive protrusion without heat treatment.

23 Claims, 4 Drawing Sheets

(56) References Cited

OTHER PUBLICATIONS

Rao, C.N.R., et al., *ChemPhysChem* [2001] 2, 78-105.
Vijayaraghavan, A., et al., *Nano Letters* (2007) 7, 6, 1556-1560.
Wu, X., et al., *Nano Letters* (2007) doi: 10.1021/nl071165+.
Wolf, M.J., et al., *Nuclear Instruments and Methods in Physics Research A* (2006) 565, 290-295.
Huang, Xiao, et al., "Inherent-opening-controlled Pattern formation in Carbon Nanotube Arrays", Nanotechnology, 2007, vol. 18, IOP Publishing.
Ko, Hyunhyub, et al., "Combing and Bending of Carbon Nanotube Arrays with Confined Microfluidic Flow on Patterned Surfaces", J. Phys. Chem. B., 2004, pp. 4385-4393, vol. 108, No. 14.
Li, Jingqi, et al., "Manipulation of Carbon Nanotubes using AC Dielectrophoresis", Applied Physics Letter, 2005, pp. 153116-153116-3, vol. 86.
Merchant, C. A., et al., "The Photoresponse of Spray-coated and Free-standing Carbon Nanotube Films with Schottky Contacts", Nanotechnology, 2009, vol. 20, IOP Publishing.
Seo, Hee-Won, et al., "Controlled Assembly of Single SWNTs Bundle using Dielectrophoresis", Microelectronic Engineering, 2005, pp. 83-89, vol. 81.

* cited by examiner

METHOD OF FORMING AN INTERCONNECT ON A SEMICONDUCTOR SUBSTRATE

FIELD OF THE INVENTION

The present invention relates to a method of forming an interconnect on a semiconductor substrate.

BACKGROUND OF THE INVENTION

In the manufacture of integrated circuits there is a continuous demand for an increase in circuit density and complexity and a decrease in device dimensions. Requirements in terms of packaging and interconnection of devices are continuously on the rise. To facilitate the transfer of signals between circuit components externally-implemented connectors have been used such as bonded chips, flip chips, package substrates, ball grid array (BGA) substrates and pin grid array (PGA) substrates.

Among known interconnect technologies the flip chip (also called "Direct Chip Attach") has the highest I/O density. In typical semiconductor fabrication a plurality of metal pads is formed on a wafer, serving as a connection for electrical input and electrical output. In the technology of flip-chip bonding, a solder material such as lead-tin solder is deposited on the metal pads of a chip. The chip is then inverted and the solder dots contacted with connectors of a circuit board. Re-melting the solder forms an interconnection. In contrast to conventional wire bonding however a large distance between individual input/output pads needs to be maintained to ensure the reliability of the device. Only a careful selection of the bump material can allow reducing bump dimensions and distances between individual bumps (for an overview see e.g. Wolf, M. J., et al., *Nuclear Instruments and Methods in Physics Research A* (2006) 565, 290-295). The conventional joining materials for flip chip packaging include eutectic Sn—Pb or high Pb solder alloys. Due to miniaturization requirements and the trend for green manufacturing, lead-free solders and adhesive flip chip technology (including isotropic, anisotropic and non-conductive adhesives) are gradually replacing the Pb-containing solders. For example, the Waste Electrical & Electronic Equipment (WEEE) Directive of the European Union has banned the use of lead from electrical and electronic components from Jul. 1, 2006. In other parts of the world, similar legislations are also expected to take effect sooner or later.

Between lead-free and solderless (adhesives) solutions, each has its own strengths and weaknesses. Lead-free soldering inherits the good alignment capability from soldering technology and has stronger joint strength; but its cost is higher than leaded solder. Another big concern over the use of lead-free solders is the long-term product reliability due to the different processing conditions. Soldering technology is also expected to hit the limit for down-scaling.

Adhesive joining is more tolerant to thermal mismatch strain and able to provide a finer pitch than a leaded joint, however it is prone to moisture attack. The moisture absorption may lead to loss of interconnection due to polymer relaxation and/or ionic migration (corrosion). Therefore, adhesive flip chips have been largely used for products in less stringent environments.

According to International Technology Roadmap for Semiconductors (Assembly and Packaging, International Technology Roadmap for Semiconductors, 2005), flip chip area array pitch (solder bumped) is going to decrease to 90 µm and flip chip on tape or film pitch will be as fine as 20 µm in 2010. Reduced pitch size (and joint height) means greater mismatch strain will be experienced by the joining material(s). To resolve such an issue, either a smaller die has to be used, which limits the I/O number in a chip, or more flexible joint materials has to be found. The adhesive flip chips, to certain extend, can provide flexibility but it suffers from the problem of long term relaxation and corrosion as discussed above. Another potential problem facing all existing packaging interconnect materials is the mass-migration induced failure such as electromigration and stress migration. The continued minimization will further increase the current density and stress gradient, thus higher risk of migration failure. Physical failure mechanisms and assessment techniques are heavily investigated in recent years.

In this regard carbon nanotubes have recently been introduced in electrical connections between semiconductor devices. For this purpose the carbon nanotubes are usually grown on the respective pads, e.g. by chemical vapor deposition in a suitable electrical field. In this regard international patent application WO 2006/048846 discloses conductive connections between components of an integrated circuit package via carbon nanotubes. The carbon nanotubes are grown on an interconnect to extend therefrom in a generally straight direction. The nanotubes are embedded in a connector and a metal pad are pressed together to form a bond. International patent application WO 2006/048847 discloses a tape adhesive type arrangement that is directionally conductive. The arrangement contains a tape base material extending laterally and having opposing upper and lower surfaces. Carbon nanotubes extend between the opposing surfaces in the general direction of the thickness of the tape.

U.S. Pat. No. 6,989,325 discloses an alternative deposition of carbon nanotubes by using carbon nanotubes that are functionalized with thiol groups at both ends. Thereby these carbon nanotubes, connect a metal pad, on which they stand vertically, to gold spheres forming a line-beam-shaped conductive bump. The gold spheres are in turn used to form a connection to a surface. Such an approach however has the draw-back that functionalization of carbon nanotubes can affect the mechanical stability and conductivity of the nanotubes.

All these approaches however require the use of elevated temperatures during the formation of the interconnect, either during growth of the carbon nanotubes or when joining gold spheres at the end of carbon nanotubes to a surface. These elevated temperatures may damage devices formed on a wafer by causing degradation of matter included therein during integrated circuit fabrication, for example matter with a low dielectric constant (low k materials). As an example, the lowest possible operating temperature for the chemical vapor deposition process is about 700° C. Such a temperature is often incompatible with integrated circuit processing requirements. Furthermore, there is a risk that under stress the formed forests of carbon nanotubes slip, thereby causing fractures, which reduce the conductivity of the interconnect.

It is therefore an object of the present invention to provide a method of forming an interconnect that avoids the drawbacks or shortcomings in the formation of the above bumps.

SUMMARY OF THE INVENTION

In a first aspect the present invention provides a method of forming a wire bond-free conductive interconnect area on a semiconductor substrate. The method includes providing a semiconductor substrate. The semiconductor substrate includes an electrically conductive protrusion, which defines a bond pad. The method further includes providing a plurality of electrically conductive nanofilaments. The method also includes immobilizing the plurality of electrically conductive nanofilaments, on the electrically conductive protrusion. Immobilization occurs by allowing at least one random portion of the electrically conductive nanofilaments along the length of the electrically conductive nanofilaments to attach to the surface of the electrically conductive protrusion. As a result an aggregate of loops of electrically conductive nanofilaments is formed on the surface of the electrically conductive protrusion. Thereby a conductive interconnect area is formed on the electrically conductive protrusion without heat treatment.

According to some embodiments the electrically conductive nanofilaments are carbon nanotubes.

In a second aspect the present invention provides a method of interconnecting two substrates in a semiconductor apparatus in a wire bond-free manner. The method includes providing a first semiconductor substrate. The first semiconductor substrate includes a first electrically conductive protrusion, which defines a first bond pad. The method further includes providing a second semiconductor substrate. The second semiconductor substrate includes a second electrically conductive protrusion, which defines a second bond pad. The method also includes providing a first plurality of electrically conductive nanofilaments. The method further includes immobilizing the first plurality of electrically conductive nanofilaments on the first electrically conductive protrusion. Immobilization occurs by allowing at least one random portion of the electrically conductive nanofilaments along the length of the electrically conductive nanofilaments of the first plurality of electrically conductive nanofilaments to attach to the surface of the first electrically conductive protrusion. As a result a first aggregate of loops of electrically conductive nanofilaments is formed on the surface of the first electrically conductive protrusion. Thereby a first conductive interconnect area is formed on the first electrically conductive protrusion without heat treatment. The method also includes providing a second plurality of electrically conductive nanofilaments. The method further includes immobilizing the second plurality of electrically conductive nanofilaments on the second electrically conductive protrusion. Immobilization occurs by allowing at least one random portion of the electrically conductive nanofilaments of the second plurality of electrically conductive nanofilaments along the length thereof to attach to the surface of the second electrically conductive protrusion. As a result a second aggregate of loops of electrically conductive nanofilaments is formed on the surface of the second electrically conductive protrusion. Thereby a second conductive interconnect area is formed on the second electrically conductive protrusion without heat treatment. The method also includes contacting the first electrically conductive protrusion, on which the first plurality of electrically conductive nanofilaments is immobilized, with the second electrically conductive protrusion, on which the second plurality of electrically conductive nanofilaments is immobilized. The method includes thereby allowing non-covalent interaction between the first and the second aggregate of loops of electrically conductive nanofilaments to join the first and the second electrically conductive protrusion together.

In a third aspect the present invention provides a method of interconnecting two semiconductor substrates, e.g. in an electrical apparatus, in a wire bond-free manner. The method includes providing a first semiconductor substrate. The first semiconductor substrate includes a first electrically conductive protrusion, which defines a first bond pad. The method further includes providing a first plurality of electrically conductive nanofilaments. The method further includes immobilizing the first plurality of electrically conductive nanofilaments on the first electrically conductive protrusion. Immobilization occurs by allowing at least one random portion of the electrically conductive nanofilaments along the length of the electrically conductive nanofilaments of the first plurality of electrically conductive nanofilaments to attach to the surface of the first electrically conductive protrusion. As a result an aggregate of loops of electrically conductive nanofilaments is formed on the surface of the first electrically conductive protrusion. Thereby a first conductive interconnect area is formed on the first electrically conductive protrusion without heat treatment. The method also includes providing a second semiconductor substrate. The second semiconductor substrate includes a second electrically conductive protrusion, which defines a second bond pad. On the second electrically conductive protrusion there is immobilized a second plurality of electrically conductive nanofilaments. Each electrically conductive nanofilament of the second plurality of electrically conductive nanofilaments has a free end. The method further includes contacting the first electrically conductive protrusion with the second electrically conductive protrusion. The method includes thereby allowing the free ends of the second plurality of electrically conductive nanofilaments on the second electrically conductive protrusion to enter the loops of the aggregate of the first plurality of electrically conductive nanofilaments on the first electrically conductive protrusion.

According to some particular embodiments of the third aspect allowing the free ends of the second plurality of electrically conductive nanofilaments to enter the loops of the aggregate of the first plurality of electrically conductive nanofilaments includes allowing non-covalent interaction between the electrically conductive nanofilaments of the first and the second plurality of electrically conductive nanofilaments. The method includes thereby allowing the first and the second electrically conductive protrusion to join together.

According to some particular embodiments of the third aspect the electrically conductive nanofilaments of the first plurality of electrically conductive nanofilaments are carbon nanotubes.

According to some particular embodiments each electrically conductive nanofilament of the second plurality of electrically conductive nanofilaments has a free end with a nano hook. In such embodiments the method further includes contacting the first electrically conductive protrusion, on which the first plurality of electrically conductive nanofilaments is immobilized, with the second electrically conductive protrusion, on which the second plurality of electrically conductive nanofilaments is immobilized. The method includes thereby allowing the hooks of the second plurality of electrically conductive nanofilaments on the second electrically conductive protrusion to catch the loops of the aggregate of the first plurality of electrically conductive nanofilaments on the first electrically conductive protrusion.

BRIEF DESCRIPTION OF THE DRAWINGS

The invention will be better understood with reference to the detailed description when considered in conjunction with the non-limiting examples and the accompanying drawings, in which.

DETAILED DESCRIPTION OF THE INVENTION

The present invention provides a method of forming a conductive interconnect area on a semiconductor substrate. Any device that makes use of or is based on the electronic properties of a semiconductor material may be used as a respective semiconductor substrate. A semiconductor substrate includes a semiconductor material such as silicon, germanium, gallium arsenide, indium arsenide, indium phosphide, silicon carbide, gallium phosphid, silicon-germanium, silicon-germanium-carbon, gallium-indium phosphide, or any composite thereof, to name a few. A typical example of a semiconductor substrate is an electronic component used in an electrical apparatus, for example a wafer such as a silicon wafer, a substrate that includes a silicon-on-insulator (SOI) structure including a silicon-on-insulator substrate, or a SiGe-on-insulator (SGOI) substrate, included in or being a chip (an integrated circuit). It may be adapted for use in e.g. a computer, a cellular phone, a digital camera, a TV, a vehicle (e.g. a car or a plane) or a digital audio player. The conductive interconnect formed by the method of the present invention does not require wire bonds and is thus for example particularly useful for wire-bond free input/output interfaces. An interconnect formed according to the method of the present invention may for instance distribute signals (e.g. clock signals), provide power or ground to any number of circuits on a semiconductor substrate (e.g. wafer). As an illustrative example, a method of the present invention may be or may be included in a method of forming a flip chip (see above).

The semiconductor substrate may be included in any desired package form, such as a dual in-line package, a pin grid array package, a leadless chip carrier package, a small-outline integrated circuit package, a plastic leaded chip carrier package, a plastic quad flat pack, a thin quad flat pack, a thin small-outline package, a ball grid array or a flip-chip ball grid array package. The semiconductor substrate can be mounted on a printed circuit board, which may include an isolating material (for instance in form of one or more layers) such as a polymer, including an epoxy resin, a phenolic resin, a urea resin, a polyvinyl chloride, a polyethylene polymer, a polypropylene polymer, a polytetrafluoroethylene, a polypropylene polymer or a polycyanurate based polymer, a metalloid compound such as silica, alumina, zirconia, silicon nitride, ceramics, as well as any combination thereof.

In a method according to the present invention a semiconductor substrate is provided, which includes an electrically conductive protrusion extending therefrom. In some embodiments a plurality of electrically conductive protrusions is included in the semiconductor substrate. In such embodiments the present method of the invention may be carried out on any number of such protrusions, including all or only one of them. This protrusion may be of any desired dimension and geometry. It may for example have a surface that is at least essentially smooth. The surface may also be rough to any degree as long as it allows for the deposition of electrically conductive nanofilaments (see below). In contrast to the conventional use of a solder ball the present invention relies on the interaction of electrically conductive nanofilaments such as carbon nanotubes as explained in more detail below. If desired, the interconnect area in a method of the present invention may therefore in some embodiments have a geometry that is the reflection of a geometry of another conductive protrusion on a further semiconductor device, with which a connection is to be established. The electrically conductive protrusion may comprise any material as long as a desired conductivity is achieved. It may for instance include a metal, including a metal alloy, or a semiconductor material. Examples of suitable metals include, but are not limited to iron (e.g. steel), aluminium, gold, silver, chromium, tin, copper, titanium, zinc, aluminium, lead and composites thereof. In some embodiments the conductive protrusion is a metal post.

The conductive nanofilaments may be conductive nanotubes, which are hollow, or nanowires, which are solid. Accordingly, the terms "nanofilament" and "nanofiber" as used herein can be used interchangeably. The nanofilaments may include any material or composite of materials allowing electrical conductivity, such as a metal (e.g. a gold or a silver nanowire), a semiconductor (e.g. a silicon or a gallium nitride nanowire) or a polymer. A further illustrative example is a nanofilament of a metal compound, such as indium phosphide (InP) or molybdenum ditelluride ($MoTe_2$). Indium phosphide is a binary semiconductor. Zinc-doped indium phosphide nanowires have recently been characterized by Alemany et al. (*Nano Letters* (2007) 7, 7, 1878-1882). Molybdenum ditelluride exists in the common semiconducting α- and in the metallic β-form. Single-walled nanotubes of molybdenum ditelluride have recently been characterized in terms of their electronic, mechanical and structural properties (Wu, X., et al., *Nano Letters* (2007) doi: 10.1021/n1071165+). Further examples of nanofilaments of a metal compound include, but are not limited to nanotubes of $MoS_2$, $WS_2$, $WSe_2$, $NbS_2$, $TaS_2$, $NiCl_2$, $SnS_2/SnS$, $HfS_2$, $V_2O_5$, CdS/CdSe and $TiO_2$. Examples of suitable electrically conductive polymers include, but are not limited to, polypyrrole, polythiophene, polyaniline, polyacetylene, poly(N-vinyl carbazole), or a copolymer such as a copolymer of pyrrole and thiophene or a copolymer of juglone and 5-hydroxy-3-thioacetic-1,4-naphthoquinone. Respective polymer fibers can conveniently be formed by nanoscale polymerization or spinning, such as electrospinning. For electrospinning, a technique well known to those skilled in the art, the selected polymer may be dissolved in a solvent with a low boiling point, such as chloroform or water. The solution may then be placed in a syringe, which is tilted at such an angle that a drop of the solution is poised at the tip of the syringe. A metal target can be placed at a preselected distance from the syringe, and a voltage difference be applied between the end of the syringe and the metal target. The voltage gives rise to an electric field on the surface of the drop of solution, which counters the surface tension that holds the drop together. Once the force generated by the electric field exceeds the surface tension of the droplet, the droplet collapses. Thereby a jet of the solvent is emitted, which is accelerated toward the metal target due to the potential difference. As the solvent evaporates fibers are generated. A further suitable polymer is a nucleic acid molecule.

Nanofilaments suitable for the present method of the invention typically have a diameter of about 1-500 nm, such as about 3-200 nm or about 10-100 nm. In some embodiments these electrically conductive nanofilaments may likewise be carbon nanotubes. In such cases a second plurality of carbon nanotubes is immobilized on the second electrically conductive protrusion. As the plurality of carbon nanotubes immobilized on the first conductive protrusion can be taken to define a plurality of electrically conductive nanofilaments, the present embodiment can also be taken to involve a first plurality of electrically conductive nanofilaments (carbon nanotubes) on a first conductive protrusion and a second plurality of electrically conductive nanofilaments on a second conductive protrusion.

Further examples of electrically conductive nanofilaments that may be used in a method according to the invention are boron nitride nanotubes and carbon nanotubes. Carbon nanotubes can be either metallic or semiconducting, while boron nitride nanotubes are semiconducting (see e.g. Ishigami, M., et al., Scanning Tunneling Microscopy/Spectroscopy and Related Techniques: 12$^{th}$ Internat. Conference, CP696 [2003], edited by P. M. Koenraad and M. Kemerink, 94-99, included herein by reference in its entirety). A boron nitride nanotube is a cylinder rolled from a hexagonal sheet of boron nitride. Carbon nanotubes are pre-formed according to any desired method (see e.g. Rao, C. N. R., et al., ChemPhysChem [2001] 2, 78-105, included herein by reference in its entirety). Similar to a boron nitride nanotube, a carbon nanotube is a cylinder of rolled up graphitic sheets. Both single- and multi-walled carbon nanotubes are known and can equally be used in the method of the present invention. The carbon nanotubes may be of any desired length, such as in the range from about 10 nm to about 500 µm, such as about 20 nm to about 100 µm or about 10 nm to about 10 µm. The conductivity of the carbon nanotubes used may be freely selected according to any specific requirements of particular embodiments. Depending on the arrangement of the carbon hexagon rings along the surface of the nanotube carbon nanotubes can be metallic or semiconducting. Any such carbon nanotubes may be used in a method according to the present invention as long as they have a conductivity that is sufficient for the purposes of the particular embodiment. Accordingly, the carbon nanotubes define electrically conductive nanofilaments.

Numerous approaches have been presented to functionalize or chemically alter carbon nanotubes in order to provide them with a chemical reactivity or to increase their solubility in certain liquids. Illustrative examples include hydrogenation, halogenation, ozonolysis, plasma activation, addition of moieties including grafting or cycloadditions, Chemical reactivity may be desired for covalent or non-covalent attachment to a surface. The electrically conductive nanofilaments, such as carbon nanotubes, used in the present invention may be of any such functionalized form, e.g. carry any desired functional group or other moiety. No modification is however required and in some embodiments it may be desired to use carbon nanotubes or other electrically conductive nanofilaments of a particularly high conductivity and stability. Since these properties can be affected by functionalization, it may therefore in some embodiments be desired to use non-functionalized nanofilaments, including non-functionalized carbon nanotubes. Furthermore, covalent or non-covalent linkage via functionalization will typically rely on point-interactions, i.e. the specific interaction of functional groups or chemical moieties. As explained further below, the present invention does not rely on such point-interactions, although they may be employed as an additional reinforcement.

A method according to the present invention generally involves the use of a fluid. As an example, the fluid may be air, in which an aerogel of carbon nanotubes is used (for an indication on the handling of a respective aerogel see e.g. Bryning, M. B., et al., Advanced Materials (2007) 19, 661-664). In typical embodiments a liquid, such as a commercially available solvent or water is used. Any desired liquid can be employed, whether an aqueous or non aqueous liquid, an organic liquid (solvent), or a nonpolar aprotic, nonpolar protic, dipolar protic, dipolar aprotic, or an ionic liquid. A suitable liquid will allow the desired immobilization process to take place. Examples of nonpolar aprotic liquids include, but are not limited to, hexane, heptane, cyclohexane, benzene, toluene, pyridine, dichloromethane, chloroform, carbon tetrachloride, carbon disulfide, tetrahydrofuran, dioxane, diethyl ether, diisopropylether, ethylene glycol monobutyl ether or tetrahydrofuran. Examples of dipolar aprotic liquids are methyl ethyl ketone, methyl isobutyl ketone, acetone, cyclohexanone, ethyl acetate, isobutyl isobutyrate, ethylene glycol diacetate, dimethylformamide, acetonitrile, N,N-dimethyl acetamide, nitromethane, acetonitrile, N-methylpyrrolidone, and dimethylsulfoxide. Examples of polar protic liquids are water, methanol, ethanol, butyl alcohol, formic acid, dimethylarsinic acid [$(CH_3)_2AsO(OH)$], N,N-dimethylformamide, N,N-diisopropylethylamine, or chlorophenol. Examples of nonpolar protic liquids are acetic acid, tert.-butyl alcohol, phenol, cyclohexanol, or aniline. Two illustrative examples of ionic liquids are 1,3-dialkylimidazolium-tetrafluoroborates and 1,3-dialkylimidazolium-hexafluoroborates.

The liquid used may include any desired number of components, including mixtures of liquids. If desired, further matter may be added to a respective liquid, for example dissolved or suspended therein. As an illustrative example an aqueous liquid may include one or more buffer compounds. Numerous buffer compounds are used in the art and may be used to carry out the various processes described herein. Examples of buffers include, but are not limited to, solutions of salts of phosphate, carbonate, succinate, carbonate, citrate, acetate, formate, barbiturate, oxalate, lactate, phthalate, maleate, cacodylate, borate, N-(2-acetamido)-2-aminoethanesulfonate (also called (ACES), N-(2-hydroxyethyl)-piperazine-N'-2-ethanesulfonic acid (also called HEPES), 4-(2-hydroxyethyl)-1-piperazine-propanesulfonic acid (also called HEPPS), piperazine-1,4-bis(2-ethanesulfonic acid) (also called PIPES), (2-[tris(hydroxylmethyl)-methylamino]-1-ethanesulfonic acid (also called TES), 2-cyclohexylamino-ethanesulfonic acid (also called CHES) and N-(2-acetamido)-iminodiacetate (also called ADA). Any counter ion may be used in these salts; ammonium, sodium, and potassium may serve as illustrative examples. Further examples of buffers include, but are not limited to, triethanolamine, diethanolamine, ethylamine, triethylamine, glycine, glycylglycine, histidine, tris(hydroxymethyl)aminomethane (also called TRIS), bis-(2-hydroxyethyl)-imino-tris(hydroxylmethyl)methane (also called BIS-TRIS), and N-[Tris(hydroxymethyl)-methyl]-glycine (also called TRICINE), to name a few. A respective buffer may be an aqueous solution of such buffer compound or a solution in a suitable polar organic solvent.

An example of further matter that may be included in a respective liquid, is a surfactant. A surfactant may for instance be a hydrocarbon compound, a hydroperfluoro carbon compound or a perfluorocarbon compound. It may for example be substituted by a sulfonic acid, a sulphonamide, a carboxylic acid, a carboxylic acid amide, a phosphate, or a hydroxyl group. Examples of a hydrocarbon based surfactant include, but are not limited to, sodium dodecyl sulfate, cetyl trimethylammonium bromide, an alkylpolyethylene ether, dodecyldimethyl (3-sulfopropyl) ammonium hydroxide ($C_{12}N_3SO_3$), hexadecyldimethyl (3-sulfopropyl) ammonium hydroxide ($C_{16}N_3SO_3$), coco (amidopropyl)hydroxyl dimethylsulfobetaine ($RCONH(CH_2)_3N^+(CH3)_2CH_2CH(OH)CH_2SO_3^-$ with $R=C_8-C_{18}$), cholic acid, deoxycholic acid, octyl glucoside, dodecyl maltoside, sodium taurocholate, or a polymer surfactant such as e.g. Supelcoat PS2 (Supelco, Bellefonte, Pa., USA), methylcellulose, hydroxypropylcellulose, hydroxyethylcellulose, or hydroxypropylmethylcellulose. The surfactant may for instance be a hydrocarbon compound, a hydroperfluoro carbon compound or a perfluorocarbon compound (supra), which is substituted by a moiety selected from the group consisting of a sulfonic acid, a sulphonamide, a carboxylic acid, a carboxylic acid amide, a phosphate, or a hydroxyl group.

Examples of perfluorocarbon-surfactants include, but are not limited to, pentadecafluorooctanoic acid, heptadecafluorononanoic acid, tridecafluoroheptanoic acid, undecafluorohexanoic acid, 1,1,1,2,4,4,5,5,6,6,7,7,8,8,9,9,10,10,11,11,11-heneicosafluoro-3-oxo-2-undecanesulfonic acid, 1,1,2,2,3,3,4,4,5,5,6,6,6-tridecafluoro-1-hexanesulfonic acid, 2,2,3,3,4,4,5,5-octafluoro-5-[(tridecafluorohexyl)oxy]-pentanoic acid, 2,2,3,3-tetrafluoro-3-[(tridecafluorohexyl)oxy]-propanoic acid], N,N'-[phosphinicobis(oxy-2,1-ethanediyl)]bis[1,1,2,2,3,3,4,4,5,5,6,6,7,7,8,8,8-heptadecafluoro-N-propyl-1-octanesulfonamide, 1,1,2,2,3,3,4,4,5,5,6,6,7,7, 8,8,8-heptadecafluoro-1-octanesulfonic acid, 1,1,2,2,3,3,4,4,5,5,6,6,7,7,8,8,8-heptadecafluoro-1-octanesulfonyl fluoride, 2-[(β-D-galactopyranosyloxy)methyl]-2-[(1-oxo-2-propenyl)amino]-1,3-propanediyl carbamic acid (3,3,4,4,5,5,6,6,7,7,8,8,8-tridecafluorooctyl)-ester, 6-(3,3,4,4,5,5,6,6,7,7,8,8,8-tridecafluorooctyl hydrogen phosphate)-D-glucose, 3-(3,3,4,4,5,5,6,6,7,7,8,8,9,9,10,10,10-heptadecafluorodecyl hydrogen phosphate)-D-glucose, 2-(perfluorohexyl)ethyl isocyanate, 2,2,3,3,4,4,5,5,6,6,7,7,8,8,8-pentadecafluoro-N-phenyl-octanamide, 1,1,2,2,3,3,4,4,5,5,6,6,7,7,8,8,9,9,10,10,11,11,12,12,12-pentacosafluoro-N-(2-hydroxyethyl)-N-propyl-1-dodecanesulfonamide, 2-methyl-,2-[[(heptadecafluorooctyl)sulfonyl]methylamino]-2-propenoic acid ethyl ester, 3-(2,2,3,3,4,4,5,5,6,6,7,7,8,8,8-pentadecafluoro-1-oxooctyl)-benzenesulfonic acid, 3-(heptadecafluorooctyl)-benzenesulfonic acid, 4-[(2,2,3,3,4,4,5,5,6,6,7,7,8,8,8-pentadecafluoro-1-oxooctyl)amino]-benzenesulfonic acid, 3-[(o-perfluorooctanoyl)phenoxy]propanesulfonic acid, N-ethyl-1,1,2,2,2-pentafluoro-N-(26-hydroxy-3,6,9,12,15,18,21,24-octaoxahexacos-1-yl)-ethanesulfonamide, 3-[ethyl[(heptadecafluorooctyl)sulfonyl]amino]-1-propanesulfonic acid, 1,2,2,3,3,4,5,5,6,6-decafluoro-4-(pentafluoroethyl)-cyclohexanesulfonic acid, 2-[1-[difluoro(pentafluoroethoxy)methyl]-1,2,2,2-tetrafluoroethoxy]-1,1,2,2-tetrafluoro-ethanesulfonic acid, N-[3-(dimethyloxidoamino)propyl]-2,2,3,3,4,4-hexafluoro-4-(heptafluoropropoxy)-butanamide, N-ethyl-N-[(heptadecafluorooctyl)sulfonyl]-glycine, or 2,3,3,3-tetrafluoro-2-[1,1,2,3,3,3-hexafluoro-2-[(tridecafluorohexyl)oxy]propoxy]-1-propanol, to name a few.

Examples of perfluorocarbon-surfactants also include polymeric compounds such as α-[2-[bis(heptafluoropropyl)amino]-2-fluoro-1-(trifluoromethyl)ethenyl]-ω-[[2-[bis(heptafluoropropyl)amino]-2-fluoro-1-(trifluoromethyl)ethenyl]oxy]-poly(oxy-1,2-ethanediyl), α-[2-[[(nonacosafluorotetradecyl)sulfonyl]propylamino]ethyl]-(ω-hydroxy-poly(oxy-1,2-ethanediyl), polyethylene glycol diperfluorodecyl ether, α-[2-[ethyl[(heptadecafluorooctyl)sulfonyl]amino]-ethyl]-ω-hydroxy-poly(oxy-1,2-ethanediyl), α-[2-[ethyl[(pentacosafluorododecyl)sulfonyl]amino]ethyl]-ω-hydroxy-poly(oxy-1,2-ethanediyl), α-[2-[[(heptadecafluorooctyl)sulfonyl]propylamino]ethyl]-ω-hydroxy-poly(oxy-1,2-ethanediyl), N-(2,3-dihydroxypropyl)-2,2-difluoro-2-[1,1,2,2-tetrafluoro-2-[(tridecafluorohexyl)oxy]ethoxy]-acetamide, α-(2-carboxyethyl)-ω-[[(tride-cafluorohexyl)oxy]methoxy]-poly(oxy-1,2-ethanediyl), α-[2,3,3,3-tetrafluoro-2-[1,1,2,3,3,3-hexafluoro-2-(heptafluoropropoxy)propoxy]-1-oxopropyl]-ω-hydroxy-poly(oxy-1,2-ethanediyl), and 2,3,3,3-tetrafluoro-2-(heptafluoropropoxy)-propionic acid polymer.

In some embodiments the liquid is a polar ionic liquid. Examples of a polar ionic liquid include, but are not limited to, 1-ethyl-3-methylimidazolium tetrafluoroborate, N-butyl-4-methylpyridinium tetrafluoroborate, 1,3-dialkylimidazolium-tetrafluoroborate, 1,3-dialkylimidazolium-hexafluoroborate, 1-ethyl-3-methylimidazolium bis(pentafluoroethyl)phosphinate, 1-butyl-3-methylimidazolium tetrakis(3,5-bis(trifluoromethylphenyl)borate, tetrabutylammonium bis(trifluoromethyl)imide, ethyl-3-methylimidazolium trifluoromethanesulfonate, 1-butyl-3-methylimidazolium methylsulfate, 1-n-butyl-3-methylimidazolium ([bmim]) octylsulfate, and 1-n-butyl-3-methylimidazolium tetrafluoroborate. Examples of a non-polar liquid include, but are not limited to mineral oil, hexane, heptane, cyclohexane, benzene, toluene, dichloromethane, chloroform, carbon tetrachloride, carbon disulfide, dioxane, diethyl ether, diisopropylether, methyl propyl ketone, methyl isoamyl ketone, methyl isobutyl ketone, cyclohexanone, isobutyl isobutyrate, ethylene glycol diacetate, and a non-polar ionic liquid. Examples of a non-polar ionic liquid include, but are not limited to, 1-ethyl-3-methylimidazolium bis[(trifluoromethyl)sulfonyl]amide bis(triflyl)amide, 1-ethyl-3-methylimidazolium bis[(trifluoromethyl)sulfonyl] amide trifluoroacetate, 1-butyl-3-methylimidazolium hexafluorophosphate, 1-hexyl-3-methyl imidazolium bis(trifluoromethylsulfonyl)imide, 1-butyl-3-methylimidazolium bis(trifluoromethylsulfonyl)imide, trihexyl(tetradecyl)phosphonium bis[oxalato(2-)]borate, 1-hexyl-3-methyl imidazolium tris(pentafluoroethyl)trifluorophosphate, 1-butyl-3-methylimidazolium hexafluorophosphate, tris(pentafluoroethyl)trifluorophosphate, trihexyl(tetradecyl)phosphonium, N"-ethyl-N,N,N',N'-tetramethylguanidinium, 1-butyl-1-methyl pyrrolidinium tris(pentafluoroethyl) trifluorophosphate, 1-butyl-1-methyl pyrrolidinium bis(trifluoromethylsulfonyl) imide, 1-butyl-3-methyl imidazolium hexafluorophosphate, 1-ethyl-3-methylimidazolium bis(trifluoromethyl sulfonyl)imide and 1-n-butyl-3-methylimidazolium.

A respective liquid may be used to encompass or surround a plurality of electrically conductive nanofilaments. The electrically conductive nanofilaments may for example be provided in the liquid, or the liquid may be added to the electrically conductive nanofilaments, for instance after they have been deposited onto the semiconductor substrate.

A method according to the present invention further includes immobilizing the plurality of electrically conductive nanofilaments on the electrically conductive protrusion of the semiconductor substrate. The present applicants made the surprising finding that neither functionalization of the surface of the protrusion on the semiconductor substrate, nor functionalization of electrically conductive nanofilaments, nor growth in situ, e.g. by chemical vapor deposition, is required to immobilize electrically conductive nanofilaments, including carbon nanotubes, but that applying a force of sufficient intensity, forcing the electrically conductive nanofilaments to contact the surface of the conductive protrusion, ultimately results in their immobilization. In particular in situ growth methods require significantly elevated temperatures (above ~500° C.), which may be detrimental to semiconductor devices, e.g. the semiconductor substrate. Also the bonding of gold spheres, to which functionalized carbon nanotubes are attached, typically requires elevated temperatures (~300° C., see U.S. Pat. No. 6,989,325). Functionalizing the surface of the conductive protrusion can avoid alterations to the carbon nanotubes, however requires the use of aggressive and reactive chemicals (Flatt, A. K., et al. *J. Am. Chem. Soc* (2005) 127, 8918-8919). Therefore contact of these chemicals needs to be restricted to the surface of the protrusion, to avoid damage of the remaining semiconductor substrate. No such harsh conditions are necessary to carry out a method according to the present invention. Using the present invention, forcing the contact of electrically conductive nanofilaments and the electrically conductive surface can for example be carried out without heat treatment, i.e. without applying heat to the semiconductor substrate. Accordingly, a method of the present invention is particularly well suited for sensitive semiconductor substrates, e.g. with temperature-sensitive structures and/or materials. In this context, the term "without heat treatment" refers to the fact that no thermal energy is deliberately introduced into the system by means of a heat source. Thus it cannot be precluded that inherently thermal energy is generated when other forms of energy are used to force the electrically conductive nanofilaments to contact the surface of the conductive protrusion. Where desired, any thermal energy generated, which can be considered waste heat, can easily be avoided or dissipated by appropriate means well established in the art, e.g. by way of a heat exchanger.

A method according to the present invention can typically be carried out in a broad temperature range from about −270° C., including about −80° C. or lower, and several hundred degrees Celsius such as e.g. +700° C. or +800° C. The available temperature range is only limited by the freezing point and boiling point (if the use of the respective liquid is desired in the respective embodiment) of a liquid used, as well as the stability of the semiconductor substrate and the electrically conductive nanofilaments. In this regard it is noted that any desired pressure may be applied, as long as the semiconductor substrate is not affected or compromised in an undesired manner. Those in the art will be aware of the dependency of the boiling point of a liquid on pressure. The above temperature ranges apply to pressures around atmospheric pressure and generally also apply to other pressure values. However, due to the dependency of the boiling point of a liquid on pressure, above a certain pressure and a certain temperature, the state of a fluid changes, turning it into a new phase and a supercritical fluid is formed. A supercritical fluid can adopt properties that partly resemble a gas and partly a liquid. No distinction can be drawn between a liquid and a gas in his state. Such a supercritical fluid is likewise suited for carrying out the method of the invention. As an illustrative example, supercritical carbon dioxide can be obtained above its critical temperature of 31.1° C. and its critical pressure of 73 atmospheres. If it is desired to operate at very low temperatures, such as for instance in liquid helium, it may be required to perform an optimization of the protocol to be used, since intermolecular forces behave differently at extremely low temperatures. Since the method does not involve applying heat, it may be advantageous to select a condition considered gentle, which typically involves temperatures below about 500° C., such as below about 400° C., below about 300° C., about 200° C. or about 100° C. In some embodiments the electrically conductive nanofilaments are immobilized on the electrically conductive protrusion at about nominal room temperature, including at about room temperature. By "nominal room temperature" it is meant a temperature from about 18° C. to about 40° C., by "room temperature" a temperature from about 18° C. to about 25° C.

In some embodiments surface tension of a liquid employed in a method of the invention is used to force the electrically conductive nanofilaments to contact the surface of the electrically conductive protrusion of the semiconductor substrate. Surface tension, an effect well known to those skilled in the art, refers to an effect that can be described as a force acting parallel to the surface of a liquid, causing the surface to act as if it were a stretched elastic membrane. The respective force can be expressed as exerted perpendicular to a line of unit length (in the surface). The amount of the surface tension depends mainly upon the forces of attraction between the molecules within the given liquid and also upon the gas, solid, or liquid in contact with it. Furthermore surface tension decreases with rising temperature, solutes can also affect surface tension. At the surface of a liquid the liquid molecules do not have other like molecules on all sides of them and consequently they cohere more strongly to those directly associated with them on the surface. As an illustration, molecules well inside a liquid may be thought of as being attracted equally in all directions by the surrounding molecules. However, if surface molecules could be displaced slightly outward from the surface, they would be attracted back by the nearby molecules. The energy responsible for the phenomenon of surface tension may be thought of as approximately equivalent to the work or energy required to remove the surface layer of molecules in a unit area.

Water is an example of a liquid with high surface tension, which is of a value of 72.8 mJ/m$^2$ at 20° C., whereas ethyl alcohol with 22.3 mJ/m$^2$ and carbon tetrachloride ($CCl_4$) with 26.6 mJ/m$^2$ have a relatively low surface tension. Some ionic liquids have a relatively high surface tension, such as 1-n-butyl-3-methylimidazolium hexafluorophosphate ([bmim][PF6]) with 45 mJ/m$^2$. When an object pierces a fluid interface, it is subject to surface tension related forces. A nanofilament is thus deflected and bent, if it is flexible enough. For small particles that pierce an interface and that are at the same time supported by a solid surface below, the interaction energies are several times larger than kT, the thermal energy, and for identical nanostructures, the interactions are often attractive. For example, for ~10 nm radii spherical particles immersed in water with an edge-to-edge separation distance of 2 radii, the attraction energy is ~100 kT.

In such embodiments surface tension is allowed to act on the electrically conductive nanofilaments by deflecting them when inside the liquid, i.e. immersed therein (see also below).

With a given plurality of electrically conductive nanofilaments a liquid is selected, which has a surface tension that is high enough to deflect them. Generally, ethyl alcohol is already of sufficient surface tension that it will deflect most, if not all, nanofilaments known to this date. The present applicants observed that ethyl alcohol can significantly deform even thick-walled carbon nanotubes. Water, which has a significantly higher surface tension than ethyl alcohol (see above), may be used if the surface tension of ethyl alcohol is suspected to be insufficient. Should even water prove to be of insufficient surface tension for a particular sort of nanofilaments, mercury with a surface tension of 465 mJ/m$^2$ can be employed. With a given liquid, electrically conductive nanofilaments are selected, which are of a flexibility that allows the surface tension of the liquid to deflect the electrically conductive nanofilaments when immersed in the liquid, upon contact with the surface of the liquid.

In a respective embodiment the selected liquid is added to the semiconductor substrate in such a manner that the liquid contacts the electrically conductive protrusion. As an illustrative example, a droplet of liquid may be formed on the respective protrusion. The plurality of electrically conductive nanofilaments is deposited on the electrically conductive protrusion. In the forgoing example of a liquid droplet, the electrically conductive nanofilaments may for instance be introduced into the liquid droplet or provided together with the liquid droplet. As a further illustrative example, the semiconductor substrate may be placed with the conductive protrusion facing upward (i.e. pointing away from the direction of gravity). In this example further matter, e.g. a liquid, a solid or semifluid matter, may be deposited on the semiconductor substrate. Thereby the entire semiconductor substrate may be covered with the exception of the surface of the electrically conductive protrusion, on which the electrically conductive nanofilaments are desired to be immobilized. On the bare surface of the electrically conductive protrusion electrically conductive nanofilaments may be deposited and the entire semiconductor substrate, including both the surface of the further matter deposited thereon and the surface of the protrusion.

In the same embodiment a portion of the selected liquid, which covers the electrically conductive nanofilaments and the conductive protrusion is allowed to be removed. Thereby firstly less space between the surface of the selected liquid and the surface of the conductive protrusion is available for the electrically conductive nanofilaments. Secondly, the portion of the selected liquid allowed to be removed is an amount sufficient to cause the electrically conductive nanofilaments to contact the surface of the selected liquid from inside the liquid. Thereby the electrically conductive nanofilaments are deflected and typically bent away from the surface of the liquid and toward the surface of the conductive protrusion. Thirdly, the amount of the portion of the selected liquid allowed to be removed leaves such little space for the electrically conductive nanofilaments that the surface tension of the liquid forces the plurality of electrically conductive nanofilaments to contact the surface of the conductive protrusion. Accordingly in such embodiment the nanofilaments are selected to be of a flexibility that allows the respective surface tension to direct the electrically conductive nanofilaments to the surface of the conductive protrusion (see above). As a result the electrically conductive nanofilaments are immobilized on the surface of the conductive protrusion. In another embodiment capillary forces are used to immobilize the electrically conductive nanofilaments on the surface of the conductive protrusion.

In another embodiment an electric field is used to force the electrically conductive nanofilaments to contact the surface of the conductive protrusion of the semiconductor substrate. This may be conveniently achieved by providing a liquid (e.g. a droplet or a liquid layer placed on matter covering the semiconductor substrate, see above). In the presence of an electric field the electrically conductive nanofilaments are charged, such that they move in a liquid under the influence of the electric field. Accordingly, dielectrophoresis can be carried out. Dielectrophoresis force originates from distribution of charges at the interface between two materials of different conductivity, and/or different permittivity. In embodiments where dielectrophoresis is applied to electrically conductive nanofilaments, the two interacting materials are electrically conductive nanofilaments (as a particle phase), and the selected liquid. The strength of the force depends strongly on the liquid and particles' electrical properties, on the particles' shape and size, as well as on the frequency of the electric field.

In the presence of the electric field, charges of the electrically conductive nanofilaments and of the medium will respond and move, and pile up on the two opposite sides of the nanofilament interface. The amount of charge at the interface depends on the field and electrical properties (conductivity and permittivity) of the electrically conductive nanofilaments, as well as those of the selected liquid. Redistribution of charges at the nanofilament interfaces results in formation of dipoles, termed induced dipoles. The direction of the dipole is decided by the polarisability of the particles, and the medium. Since the applied electric field is not uniform, the charges in the dipole are exposed to a different Coulomb force. Accordingly, each charge of the dipole experiences different Coulomb force, which results in a net translational force acting on the dipole. If an alternating electrical field is used, dielectrophoretic collection will likewise occur because the polarization will reverse each time the field does. Recapitulatory, using dielectrophoresis a force can be applied to the plurality of electrically conductive nanofilaments, which (i) moves the electrically conductive nanofilaments to the surface of the electrically conductive protrusion and (ii) even upon contact to the electrically conductive protrusion further maintains the force upon the electrically conductive nanofilaments to contact the respective surface. Dielectrophoresis has previously been found useful to bridge the gap between electrodes using gallium nitride and silver nanowires as well as carbon nanotubes in that each end of a respective nanofilament attaches to opposing electrodes (Seo, H. W., et al., *Current Applied Physics* (2006) 6S1, e216-e219). However, bridging a gap in advance is not applicable to forming an interconnect area, which can then be connected to another interconnect area.

In some embodiments radio frequency dielectrophoresis is used to move electrically conductive nanofilaments and thereby force them to contact the electrically conductive protrusion. This method allows depositing electrically conductive nanofilaments on large scale and at high density—e.g. several million nanotubes per square centimeter—where this is desired (see Jijayaraghavan, A., et al., *Nano Letters* (2007) 7, 6, 1556-1560). It is however to be noted that in aqueous surfactant solution single walled metallic carbon nanotubes have been observed to align parallel to the electric field lines, which may be disadvantageous in the formation of aggregates of loops (ibid.). In yet another embodiment of the method of the invention a magnetic field is used to immobilize the electrically conductive nanofilaments on the conductive protrusion. If desired, the aggregation of electrically conductive nanofilaments, e.g. carbon nanotubes, can be monitored, for example using Raman spectroscopy (Ericson, L. M., & Pehrsson, P. E., *J. Phys. Chem.* (2005) 109, 20276-20280).

By forcing the electrically conductive nanofilaments to contact the electrically conductive protrusion, attachment to the surface thereof occurs. Generally at least one random portion along the length of the electrically conductive nanofilaments attaches to the surface of the electrically conductive protrusion. As the attachment occurs randomly at any portion of the lateral wall of the cylinder defining the electrically conductive nanofilaments, different electrically conductive nanofilaments of the plurality of electrically conductive nanofilaments generally attach at different locations/regions of their lateral walls to the electrically conductive protrusion. Where desired, attachment to a certain region of the electrically conductive nanofilaments to the respective protrusion may be directed or controlled, e.g. by means of a pretreatment of the electrically conductive nanofilaments (such as functionalization).

In some embodiments the electrically conductive nanofilaments are immobilized to be evenly distributed on the surface of the electrically conductive protrusion. In some embodiments, a method according to the invention further includes depositing the electrically conductive nanofilaments only on a selected region, e.g. a pattern, of the surface of the electrically conductive protrusion. As an illustrative example, the electrically conductive protrusion may have an edge, such as a circumferential edge. In such an embodiment the plurality of electrically conductive nanofilaments can for instance be immobilized at least essentially adjacent to the edge (including a circumferential edge). Thereby a central bare area may be formed on the electrically conductive protrusion, i.e. a central (including axially located or located slightly edgeways from the geometric midpoint) empty area that is at least essentially void of electrically conductive nanofilaments. Patterning in any desired configuration may include the use of additional matter in order to cover a selected region of the conductive protrusion, thus making it inaccessible for immobilization of electrically conductive nanofilaments. Patterning may also be a consequence of the action of a force applied to compel the electrically conductive nanofilaments to attach to the surface of the conductive protrusion. Such inherent patterning (see e.g. the examples below and FIG. 6) allows for a dramatic size reduction of the electrically conductive protrusion in comparison to conventional solder bump technology. Using a method according to the present invention the finest pitch can thus be realized. In fact, the present invention completely removes the constraint on fine pitch from the interconnect material itself. Using a method of the present invention, the bottle-neck for fine-pitch flipchip packaging is expected to shift to the alignment precision of the die bonder.

Nanofilaments, and in particular carbon nanotubes, are known to tend to form entangled aggregates, which give rise to bundles and complex networks. The present invention makes use of this tendency, rather than trying to establish an ordered structure such as a forest (or array) of nanotubes. Thus an aggregate of loops of electrically conductive nanofilaments is formed on the surface of the electrically conductive protrusion. This aggregate of loops defines an interconnect area. Another interconnect area involving electrically conductive nanofilaments, e.g. immobilized on the surface of a conductive protrusion, on a further semiconductor substrate may then be used to interconnect the two respective semiconductor substrates. Such semiconductor substrate may for instance be components of an electric apparatus.

In some embodiments the two semiconductor substrates each include an electrically conductive protrusion. In such embodiments the first conductive protrusion on the first semiconductor substrate is typically to be interconnected with the second conductive protrusion on the second semiconductor substrate. In one embodiment both conductive interconnects, i.e. on the first and on the second semiconductor substrate, are formed as described above by immobilizing electrically conductive nanofilaments on each the first and the second conductive protrusion. The first and the second conductive protrusion can then be contacted in order to establish a connection by joining the first and the second electrically conductive protrusion together. This allows non-covalent interaction between the first and the second aggregate of loops of electrically conductive nanofilaments. Examples of non-covalent forces involved in establishing such a non-covalent interaction are van-der-Waals interactions, Casimir interactions, electrostatic interactions, hydrophobic interactions, hydrogen bonding, solvation forces and Coulomb interactions. It has been established that such forces are of much higher importance on the nanoscale than on the macrscale. In some embodiments the second semiconductor substrate includes an electrically conductive via. In such embodiments the conductive protrusion on the first semiconductor substrate is typically to be interconnected with the via on the second semiconductor substrate. The via may include immobilized electrically conductive nanofilaments, such that a connection can be established in an analogous manner as described above.

In some embodiments a conductive interconnect is formed on a first semiconductor substrate as described above. A second semiconductor substrate with a second electrically conductive protrusion, on which a plurality of electrically conductive nanofilaments is immobilized, may then be provided. The nanofilaments on the first and the second electrically conductive protrusion are independently selected from one another (see above for examples). As an illustrative example, in some embodiments the electrically conductive nanofilaments on the first conductive protrusion are boron nitride nanotubes. In some embodiments the electrically conductive nanofilaments on the second electrically conductive protrusion may likewise be boron nitride nanotubes. In such cases a second plurality of boron nitride nanotubes is immobilized on the second electrically conductive protrusion. As the plurality of boron nitride nanotubes immobilized on the first conductive protrusion can be taken to define a plurality of electrically conductive nanofilaments, the present embodiment can also be taken to involve a first plurality of electrically conductive nanofilaments (in the present example boron nitride nanotubes) on a first conductive protrusion and a second plurality of electrically conductive nanofilaments on a second conductive protrusion.

The electrically conductive nanofilaments on the respective second protrusion may be aligned to the surface of the second conductive protrusion in any manner as long as an interaction with the plurality of electrically conductive nanofilaments, which is immobilized on the first conductive protrusion, can take place. The electrically conductive nanofilaments may for instance be randomly orientated with respect to the surface or pointing away therefrom (e.g. as a nanotube forest). They may for instance form an aggregate of loops of electrically conductive nanofilaments. Thus in some embodiments there are a first (e.g., carbon nanotubes) and a second aggregate of loops of electrically conductive nanofilaments involved. In one embodiment the electrically conductive nanofilaments immobilized on the second conductive protrusion define an array. In one embodiment each electrically conductive nanofilament of the second plurality of electrically conductive nanofilaments has a free end.

As in the embodiment described above, in some embodiments a connection can then be established between the first and the second conductive protrusion by contacting them with each other. Non-covalent interaction between the first and the second aggregate of loops of electrically conductive nanofilaments (see above) can form an interconnect between the two semiconductor substrates. Non-covalent interaction may for example occur between the aggregate of loops of electrically conductive nanofilaments such as carbon nanotubes formed on the first conductive protrusion and an aggregate of loops of electrically conductive nanofilaments present on the second conductive protrusion.

Such establishment of a connection may be assisted geometrically where the nanofilaments immobilized on the second electrically conductive protrusion have free ends. In this case contacting the first and the second conductive protrusion includes allowing the free ends of these nanofilaments to enter the loops of the aggregate of the first plurality of electrically conductive nanofilaments, which are immobilized on the first electrically conductive protrusion.

In one embodiment the electrically conductive nanofilaments immobilized on the second protrusion are electrically conductive nanofilaments having nano hooks. For example each nanofilament of the second plurality of electrically conductive nanofilaments may have a free end with a nano hook. As an illustrative example, in single-walled carbon nanotubes a replacement of hexagons of carbon atoms by pentagon-heptagon pairs is known to result in the formation of a permanent bend of a respective carbon nanotube. A respective bend may for example be induced during field-directed synthesis by growing a carbon nanotube in an activated field. Activation of a perpendicular field electrode induces a nano hook, as disclosed in US patent application 2007/0114120. In this embodiment, upon contacting the first electrically conductive protrusion, on which the first plurality of electrically conductive nanofilaments is immobilized, with the second electrically conductive protrusion, on which the second plurality of electrically conductive nanofilaments is immobilized, the hooks of the second plurality of electrically conductive nanofilaments on the second electrically conductive protrusion are allowed to catch the loops of the aggregate of the first plurality of nanotubes on the first electrically conductive protrusion. In such embodiments mechanical hooking as well as non-covalent interactions between the electrically conductive nanofilaments may contribute to the formation of a conductive interconnect.

In any of the forgoing embodiments it may furthermore be desired to apply additional pressure to further improve the contact, in order that that the non-covalent interactions have a chance to form or to allow the hooking of the nanohooks into the loops of nanotubes. As an illustrative example, the first semiconductor substrate and the second semiconductor substrate may be brought into an orientation where the first electrically conductive protrusion on the first semiconductor substrate and the second electrically conductive protrusion on the second semiconductor substrate face each other. In this orientation the immobilized electrically conductive nanofilaments on the two semiconductor substrates stand vis-à-vis. Physical contact between the first and second electrically conductive protrusion may then be brought about by moving the two semiconductor substrates toward each other or by moving one of the two semiconductor substrates toward the other. Mechanical force may then be applied, thereby pressing the first semiconductor substrate against the second semiconductor substrate. If desired, the formed interconnect can also be sealed in a further processes to prevent vertical separation.

Figure 1:
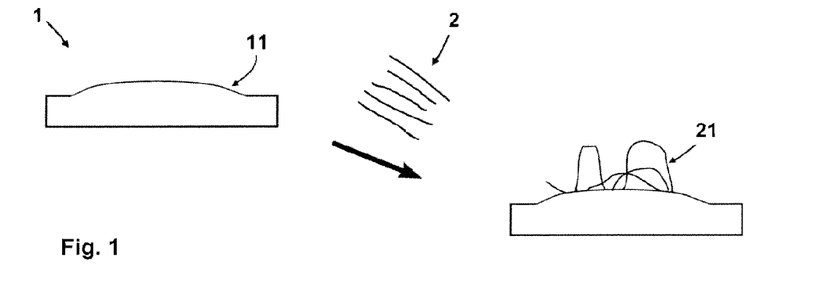
FIG. 1 schematically illustrates the method of the present invention, in which a plurality of electrically conductive nanofilaments (2) is immobilized on an electroconductive protrusion (11) of a semiconductor substrate (1), thereby forming an aggregate of loops of electrically conductive nanofilaments (21).
Figure 2:
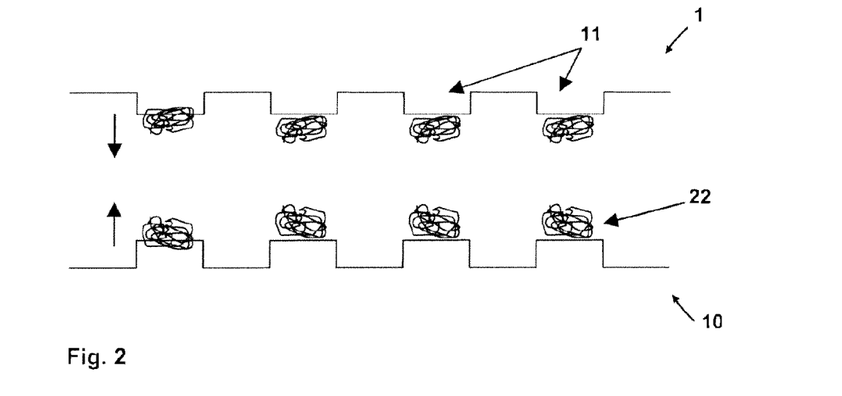
FIG. 2 depicts a schematic representation of a method of interconnecting two semiconductor substrates (1) and (10) according to the present invention. On electrically conductive protrusions (11) aggregates of loops of electrically conductive nanofilaments (22) are formed. The two substrates are brought together, so that the electrically conductive protrusions (11) of the substrates (1) and (10) are contacting each other.
Figure 3:
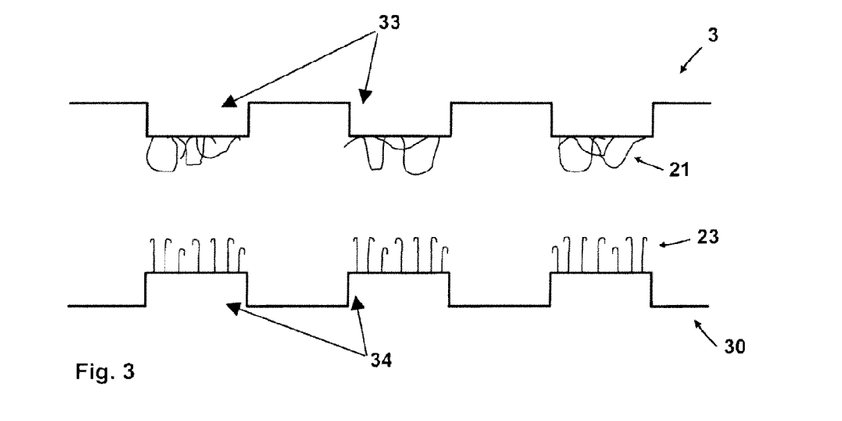
FIG. 3 depicts a schematic representation of a further method of interconnecting two semiconductor substrates (3) and (30) according to the present invention. On electrically conductive protrusions (33) of a first substrate (3) aggregates of loops of electrically conductive nanofilaments (21) are formed. A second semiconductor substrate (30) is provided with electrically conductive protrusions (34) on which electrically conductive nanofilaments with hooks (21) are immobilized. The two substrates are brought together, so that the electrically conductive protrusions (33,34) of the substrates (3) and (30) are contacting each other.
Figure 4:
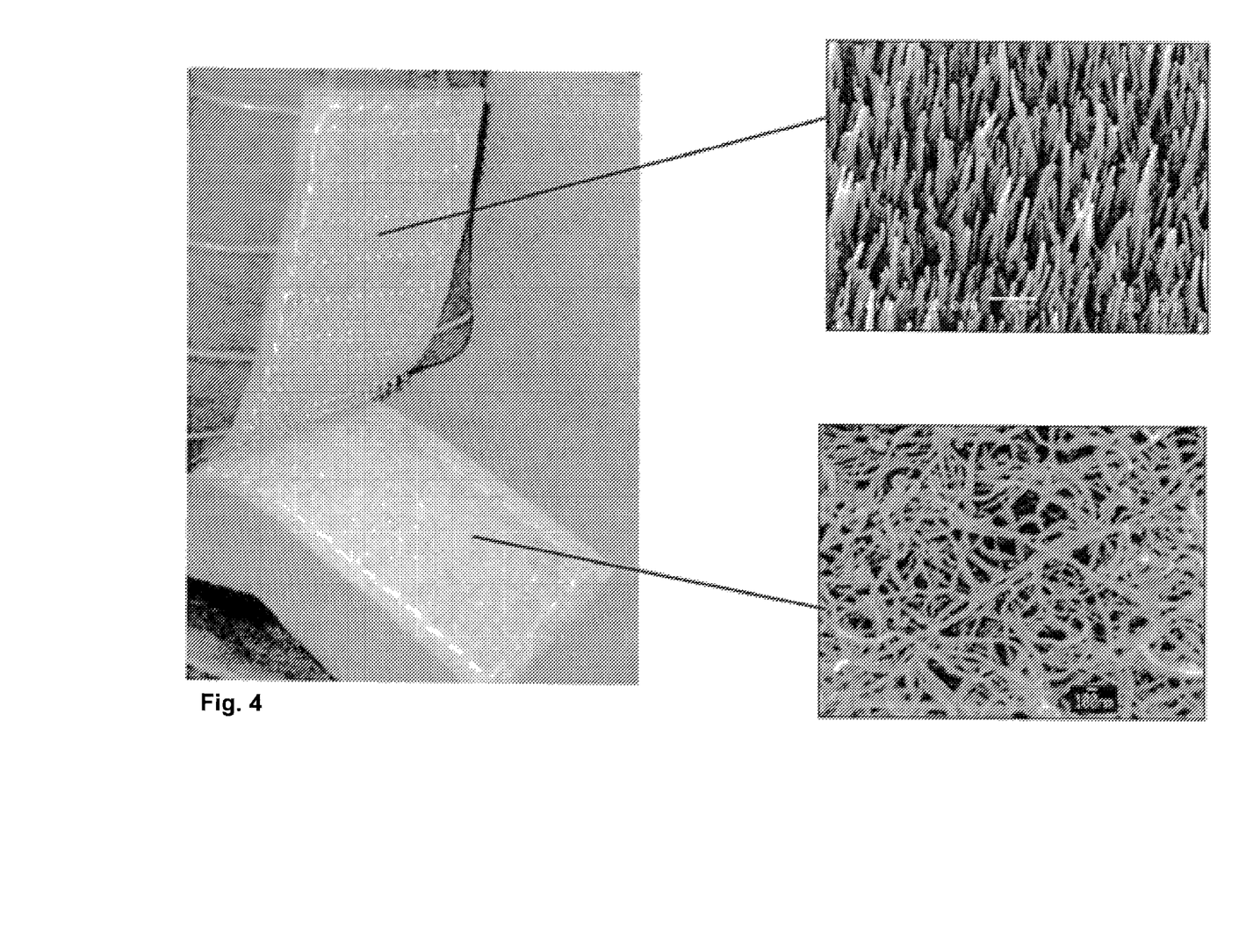
FIG. 4 compares a Velcro®-like interconnect in the form of a common hook-and-loop fastener (left) and using carbon nanotubes according to the present invention (right).
Figure 6:
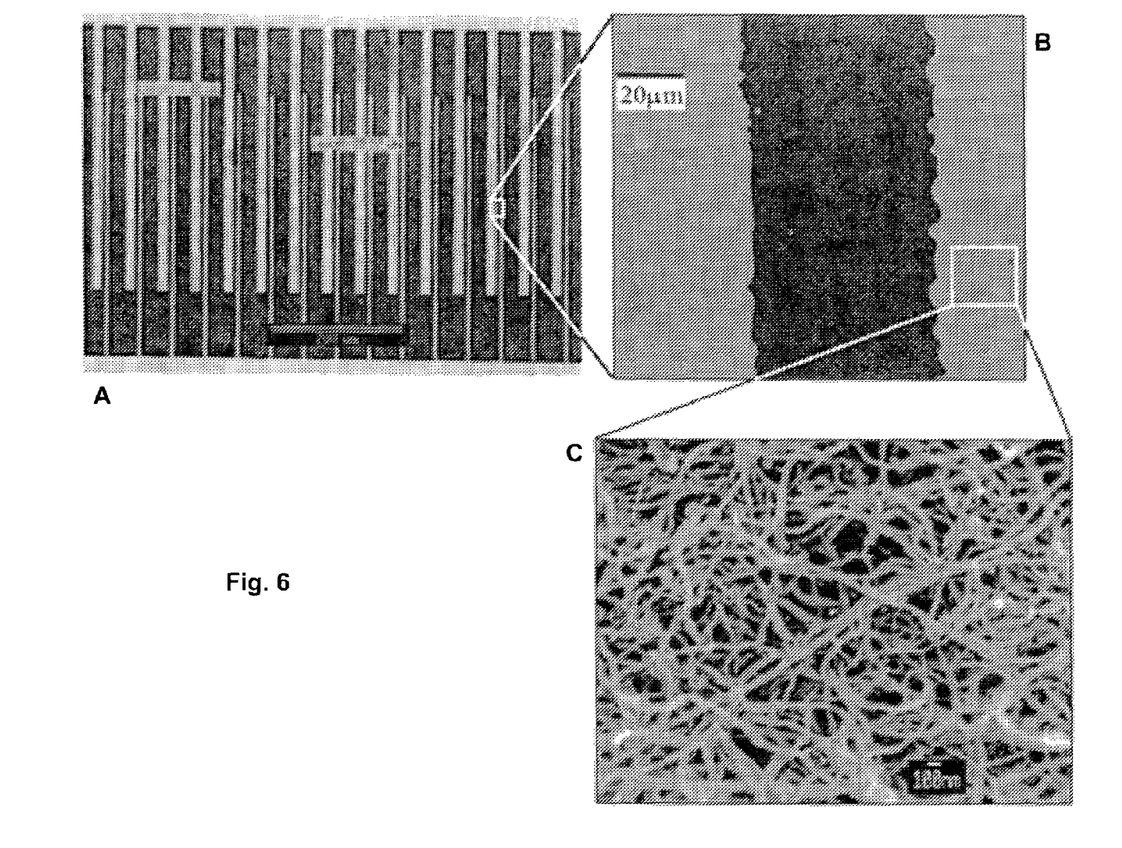
FIG. 6 illustrates a patterned interconnect area according to the present invention with (A) showing an electrode test design, (B) a scanning electron microscopy micrograph, showing a dark bare region free of carbon nanotubes and two grey regions on which carbon nanotubes are immobilized, and (C) a loose loop orientation of the carbon nanotubes on designed regions.

A conductive interconnect formed according to a method of the present invention may include a first aggregate of loops (e.g. woven) of electrically conductive nanofilaments (such as carbon nanotubes) as depicted on the lower right hand side of FIG. 4, resembling the loops in a Velcro® fastener. A respective interconnect may then include a second similar aggregate of loops of conductive nanofilaments (such as carbon nanotubes, boron nitride nanotubes, etc.). It may additionally or alternatively include an array of conductive nanofilaments, including e.g. carbon nanotubes. In such embodiments the nanofilaments may resemble posts as shown in the upper right hand side of FIG. 4. When the two sides are pressed together, the posts bonds the loops and hold the two semiconductor substrates, e.g. circuit and board, together by van-der-Waals force as a result of the length dimension. Unlike in a Velcro® fastener, it is not required (although viable and practicable) that the posts of the conductive interconnect formed in the method of the present invention have an actual hook at their end. It is understood that the illustration of a Velcro® hook-loop fastener is rather limited, since the strength of the respective hook and loop bond depends on how well the hooks are embedded in the loops. In contrast thereto in an interconnect of the present invention adhesive forces, such as van-der-Waals forces establish a connection, such that the hooks or posts corresponding to the respective structures of a Velcro® may be replaced by a loop structure as depicted in FIG. 6C. The establishment of an interconnect thus rather resembles the adhesive forces employed by geckos (Autumn, K., et al, *Proc. Natl. Acad. Sci. U.S.A.* (2002) 99, 19, 12252-12256).

An interconnect based on nanofilaments according to the present invention is lead-free. Further it is highly flexible in the joints, thus it has the best potential to be used in flexible electronic devices and displays, e.g. electronics on polymer substrate. This flexibility further provides connections of uniform conductivity, regardless of mechanical forces acting on the interconnect. Structures entirely based on arrays of electrically conductive nanofilaments are in contrast thereto susceptible to mechanical strain and torsion. Such mechanical forces have been shown to alter the resistance of carbon nanotubes grown by chemical vapour deposition on a silicon wafer (Hall, A. R., et al. *Nature Nanotechnology* (2007) doi: 10.1038/nnano. 2007.179). The interconnect formed by a method of the present invention is also more tolerant to misplacement during joining process than conventional solder technology, thus the yield is expected to increase. A respective nanofilament based interconnect furthermore has the highest resistance to corrosion and migration failure among any known chip joining technologies. As noted above, structures with the finest spacing can be fabricated using a nanofilament based method of the invention. The method further avoids traditional high temperatures of carbon nanotube growth. A method according to the present invention can in contrast thereto be carried out at room temperature with assistance from e.g. capillary forces and/or dielectrophoresis forces (see above).

In order that the invention may be readily understood and put into practical effect, particular embodiments will now be described by way of the following non-limiting examples.

EXAMPLES

Example 1

Immobilizing Carbon Nanotubes Using Dielectrophoresis

The present example illustrates an embodiment of immobilizing a plurality of carbon nanotubes on an electrically conductive protrusion. The proof-of-concept chip used for dielectrophoresis process was fabricated by using standard microlithography procedures: substrate size 40×20 mm, electrode width 2 mm (for manual manipulation on the prototype, actual device can be much smaller), electrode clearance 30-40 µm.

The average length of carbon nanotubes used in the current example was ~2 µm. The carbon nanotubes were suspended in deionized water (DI water). All dielectrophoresis experiments were done under normal room temperature.

Function generator TTi TG 1304 was then activated, and the chip was connected to the function generator prior to application of the carbon nanotube dispersion. It is important to activate the function generator before the carbon nanotube colloidal system is applied onto the chip. Otherwise, electrolysis of water had been observed if the carbon nanotube dispersion is applied before the function generator is activated, which lead to destruction of the electrode edge due to bubble burst. This electrolysis is caused by the power surge that normal to occur when an electrical instrument is activated.

The peak-to-peak current, and the peak-to-peak potential across the electrode were then measured by using Hewlett-Packard 34401A Digital Multimeter, and Tektronix TDS 220 Oscilloscope, respectively. Conductance of the chip was obtained by dividing the current, with the potential.

Experiments were done to investigate the effect of peak-to-peak potential and carbon nanotubes concentration on dielectrophoresis (DEP), as well as electrical behavior of the carbon nanotube assembly. Particularly, 20 µl of carbon nanotubes dispersion with a carbon nanotubes concentration of 0.1, 0.05, 0.025, or 0.01 mg/ml was applied onto the chip. The potential applied onto the chip was tested on 5 V, 10 V or 20 V. The frequency and the DC offset have been set constant at 1 MHz, and 0 V, respectively throughout all the experiments. The multi walled carbon nanotube dispersion was then let dry in air.

One example of experiments—Sample DEP—a drop of carbon nanotube dispersion with properties as follows: $\sigma=1.8\times10^{-5}$ S/cm; pH=5; carbon nanotubes [CNT]=0.005 mg/ml; had been applied onto the gold electrode.

| | $\sigma$ (S/cm) | [CNT] (mg/ml) | pH | Vpp (V) | f (Hz) | VDC (V) |
|---|---|---|---|---|---|---|
| Sample DEP | $1.8 \times 10^{-5}$ | 0.005 | 5 | 10 | $1 \times 10^6$ | 0 |

Data

Figure 5A:
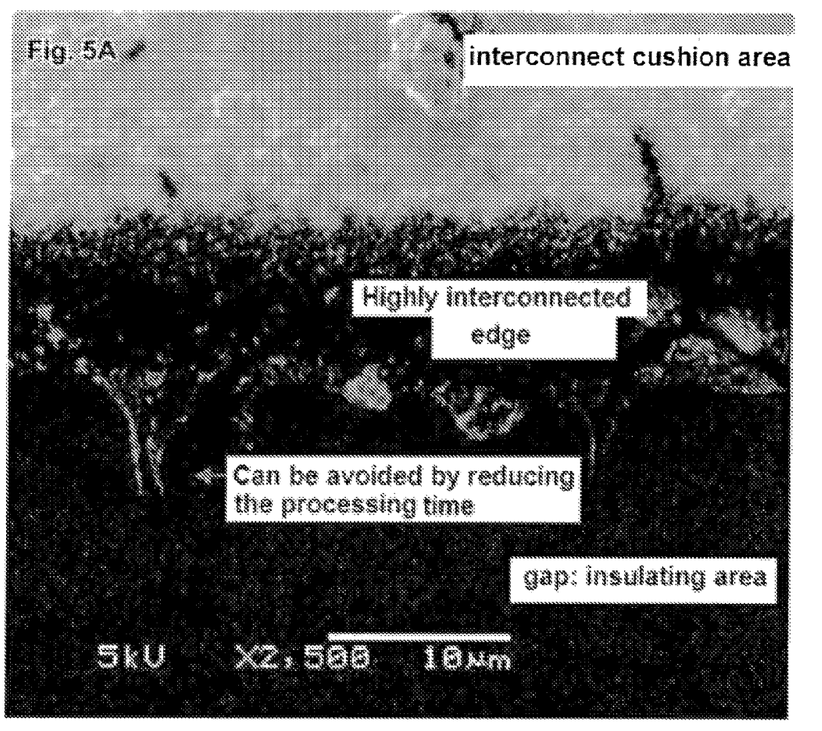
FIG. 5 depicts two examples (A, B) of carbon nanotubes immobilized on an electrically conductive protrusion according to a method of the present invention.
Figure 5B:
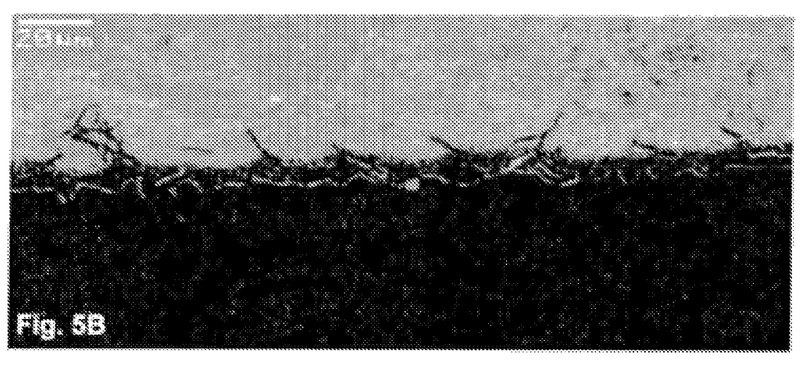

With the dielectrophoresis method, carbon nanotubes tend to cluster and form aggregates on the electrode edge as shown in FIG. 5. Out-of-focus carbon nanotubes indicate that the cluster of carbon nanotubes aggregates on the electrode edge has a height greater than depth of focus of the microscope in our setting (i.e. carbon nanotube clusters at least have a height of a few microns).

No aggregate of carbon nanotubes is found in the middle of the electrode gap. However, instead of being uniformly distributed over the gold electrodes, nanotubes tend to position themselves on the edge of the gold electrode. Such a property enables further reducing of electrode size, because the edge deposition of carbon nanotubes itself is enough for interconnect purpose.

Example 2

Dewetting-Facilitated Selective Deposition of Carbon Nanotubes

The present example illustrates a further embodiment of immobilizing a plurality of carbon nanotubes on an electrically conductive protrusion. The same experimental setup as in example 1 was used. The AC potential was set to 0 V and all other parameters and process steps were kept the same. No aggregate of carbon nanotubes was found in the middle of the electrode gap either. Through drying process, surface tension drew all nanotubes onto the gold electrode. Again the carbon nanotubes clustered, forming an aggregate of loops on the electrode surface as shown in FIG. 6. It appeared that the nanotubes were more uniformly distributed than the ones in DEP method (Example 1). It is noted that optimal parameters for this method have not been systematically studied yet.

The listing or discussion of a previously published document in this specification should not necessarily be taken as an acknowledgement that the document is part of the state of the art or is common general knowledge. All documents listed are hereby incorporated herein by reference in their entirety for all purposes.

The invention has been described broadly and generically herein. Each of the narrower species and subgeneric groupings falling within the generic disclosure also form part of the invention. This includes the generic description of the invention with a proviso or negative limitation removing any subject matter from the genus, regardless of whether or not the excised material is specifically recited herein.

The invention illustratively described herein may suitably be practiced in the absence of any element or elements, limitation or limitations, not specifically disclosed herein. Thus, for example, the terms "comprising", "including," containing", etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed. Additional objects, advantages, and features of this invention will become apparent to those skilled in the art upon examination of the foregoing examples and the appended claims. Thus, it should be understood that although the present invention is specifically disclosed by exemplary embodiments and optional features, modification and variation of the inventions embodied therein herein disclosed may be resorted to by those skilled in the art, and that such modifications and variations are considered to be within the scope of this invention. In addition, where features or aspects of the invention are described in terms of Markush groups, those skilled in the art will recognize that the invention is also thereby described in terms of any individual member or subgroup of members of the Markush group.

What is claimed is:

1. A method of forming a wire bond-free conductive interconnect area on a semiconductor substrate, the method comprising:
   providing a semiconductor substrate, said semiconductor substrate comprising an electrically conductive protrusion defining a bond pad;
   providing a plurality of electrically conductive nanofilaments; and
   immobilizing the plurality of electrically conductive nanofilaments on the electrically conductive protrusion by allowing at least one random portion of the electrically conductive nanofilaments along the length thereof to attach to the surface of the electrically conductive protrusion, and deflecting a plurality of the electrically conductive nanofilaments attached to the surface of the electrically conductive protrusion forming an aggregate of loops of electrically conductive nanofilaments on the surface of the electrically conductive protrusion, thereby forming a conductive interconnect area on the electrically conductive protrusion without heat treatment; and wherein the plurality of electrically conductive nanofilaments is dispersed in a liquid and is immobilized and deflected on the electrically conductive protrusion according to one of A) by dielectrophoresis; and B) by (i) depositing the plurality of electrically conductive nanofilaments dispersed in the liquid on the electrically conductive protrusion and (ii) allowing a portion of the liquid to be removed, thereby allowing the surface tension of the liquid to force the plurality of electrically conductive nanofilaments to contact the surface of the conductive protrusion; and wherein the electrically conductive nanofilaments are selected to be of a flexibility that allows the surface tension of the liquid to deflect the electrically conductive nanofilaments dispersed therein upon contact with the surface of the liquid.

2. The method of claim 1, wherein immobilizing the plurality of electrically conductive nanofilaments on the electrically conductive protrusion is carried out at about nominal room temperature.

3. The method of claim 1, wherein the liquid comprises at least one of water, an alcohol and a polar ionic liquid.

4. The method of claim 1, wherein allowing a portion of the liquid to be removed is carried out by allowing a portion of the liquid to evaporate.

5. The method of claim 1, wherein the electrically conductive nanofilaments are selected from the group consisting of metal nanowires, semiconductor nanowires, nanofilaments of a metal compound, nanofilaments of a polymer, boron nitride nanotubes and carbon nanotubes.

6. The method of claim 5, wherein the carbon nanotubes are non-functionalized.

7. The method of claim 1, wherein the electrically conductive protrusion has a circumferential edge, and wherein the plurality of electrically conductive nanofilaments is immobilized at least essentially adjacent to said edge, thereby forming a central bare area on the electrically conductive protrusion in that said central bare area is at least essentially void of electrically conductive nanofilaments.

8. A method of interconnecting two semiconductor substrates in a wire bond-free manner, the method comprising:

providing a first semiconductor substrate, said first semiconductor substrate comprising a first electrically conductive protrusion defining a first bond pad;

providing a second semiconductor substrate, said second semiconductor substrate comprising a second electrically conductive protrusion defining a second bond pad;

providing a first plurality of electrically conductive nanofilaments;

immobilizing the first plurality of electrically conductive nanofilaments on the first electrically conductive protrusion by allowing at least one random portion of said electrically conductive nanofilaments along the length thereof to attach to the surface of the first electrically conductive protrusion, and deflecting a plurality of the electrically conductive nanofilaments attached to the surface of the first electrically conductive protrusion forming a first aggregate of loops of electrically conductive nanofilaments on the surface of the first electrically conductive protrusion, thereby forming a first conductive interconnect area on the first electrically conductive protrusion without heat treatment;

providing a second plurality of electrically conductive nanofilaments;

immobilizing the second plurality of electrically conductive nanofilaments on the second electrically conductive protrusion by allowing at least one random portion of said electrically conductive nanofilaments along the length thereof to attach to the surface of the second electrically conductive protrusion, and deflecting a plurality of the electrically conductive nanofilaments attached to the surface of the second electrically conductive protrusion forming a second aggregate of loops of electrically conductive nanofilaments on the surface of the second electrically conductive protrusion, thereby forming a second conductive interconnect area on the second electrically conductive protrusion without heat treatment; and contacting the first electrically conductive protrusion, on which the first plurality of electrically conductive nanofilaments is immobilized, with the second electrically conductive protrusion, on which the second plurality of electrically conductive nanofilaments is immobilized, thereby allowing non-covalent interaction between the first and the second aggregate of loops of electrically conductive nanofilaments to join the first and the second electrically conductive protrusion together; and wherein the first and/or second plurality of electrically conductive nanofilaments is dispersed in a liquid and is immobilized and deflected on the electrically conductive protrusion according to one of A) by dielectrophoresis; and B) by (i) depositing the plurality of electrically conductive nanofilaments dispersed in the liquid on the electrically conductive protrusion and (ii) allowing a portion of the liquid to be removed, thereby allowing the surface tension of the liquid to force the plurality of electrically conductive nanofilaments to contact the surface of the conductive protrusion; and wherein the electrically conductive nanofilaments are selected to be of a flexibility that allows the surface tension of the liquid to deflect the electrically conductive nanofilaments dispersed therein upon contact with the surface of the liquid.

9. The method of claim 8, wherein the non-covalent interaction is at least one of a Casimir interaction, a hydrophobic interaction, hydrogen bonding, a solvation force and a Vander-Waals interaction.

10. The method of claim 8, wherein contacting the first electrically conductive protrusion with the second electrically conductive protrusion is carried out by (i) aligning the first semiconductor substrate and the second semiconductor substrate such that the first electrically conductive protrusion on the first semiconductor substrate and the second electrically conductive protrusion on the second semiconductor substrate face each other, and (ii) applying mechanical force, thereby pressing the first semiconductor substrate against the second semiconductor substrate.

11. The method of claim 8, wherein immobilizing the first plurality of electrically conductive nanofilaments on the first electrically conductive protrusion is carried out at about nominal room temperature.

12. The method of claim 8, wherein immobilizing the second plurality of electrically conductive nanofilaments on the second electrically conductive protrusion is carried out at about nominal room temperature.

13. The method of claim 8, wherein the electrically conductive nanofilaments of the first plurality of electrically conductive nanofilaments are selected from the group consisting of metal nanowires, semiconductor nanowires, nanofilaments of a metal compound, nanofilaments of a polymer, boron nitride nanotubes and carbon nanotubes.

14. The method of claim 8, wherein the electrically conductive nanofilaments of the second plurality of electrically conductive nanofilaments are selected from the group consisting of metal nanowires, semiconductor nanowires, nanofilaments of a metal compound, nanofilaments of a polymer, boron nitride nanotubes and carbon nanotubes.

15. The method of claim 8, wherein the method is a method of forming a flip chip.

16. A method of interconnecting two semiconductor substrates in a wire bond-free manner, the method comprising:
providing a first semiconductor substrate, said first semiconductor substrate comprising an electrically conductive protrusion defining a first bond pad;
providing a first plurality of electrically conductive nanofilaments;
immobilizing the first plurality of electrically conductive nanofilaments on the first electrically conductive protrusion by at least one random portion of the electrically conductive nanofilaments along the length thereof to attach to the surface of the first electrically conductive protrusion;
deflecting a plurality of the electrically conductive nanofilaments attached to the surface of the first electrically conductive protrusion forming an aggregate of loops of electrically conductive nanofilaments on the surface of the first electrically conductive protrusion, thereby forming a first conductive interconnect area on the first electrically conductive protrusion without heat treatment;
providing a second semiconductor substrate, said second semiconductor substrate comprising a second electrically conductive protrusion defining a second bond pad, wherein on the second electrically conductive protrusion there is immobilized a second plurality of electrically conductive nanofilaments, wherein each electrically conductive nanofilament of the second plurality of electrically conductive nanofilaments has a free end; and
contacting the first electrically conductive protrusion, on which the first plurality of electrically conductive nanofilaments is immobilized, with the second electrically conductive protrusion, on which the second plurality of electrically conductive nanofilaments is immobilized, thereby allowing the free ends of the second plurality of electrically conductive nanofilaments on the second electrically conductive protrusion to enter the loops of the aggregate of the first plurality of electrically conductive nanofilaments on the first electrically conductive protrusion; and
wherein the first and/or second plurality of electrically conductive nanofilaments is dispersed in a liquid and is immobilized and/or deflected on the electrically conductive protrusion according to one of A) by dielectrophoresis; and
B) by (i) depositing the plurality of electrically conductive nanofilaments dispersed in the liquid on the electrically conductive protrusion and (ii) allowing a portion of the liquid to be removed, thereby allowing the surface tension of the liquid to force the plurality of electrically conductive nanofilaments to contact the surface of the conductive protrusion; and wherein the electrically conductive nanofilaments are selected to be of a flexibility that allows the surface tension of the liquid to deflect the electrically conductive nanofilaments dispersed therein upon contact with the surface of the liquid.

17. The method of claim 16, wherein the second plurality of electrically conductive nanofilaments defines an array.

18. The method of claim 16, wherein the electrically conductive nanofilaments of the first plurality of electrically conductive nanofilaments are selected from the group consisting of metal nanowires, semiconductor nanowires, nanofilaments of a metal compound, nanofilaments of a polymer, boron nitride nanotubes and carbon nanotubes.

19. The method of claim 16, wherein the electrically conductive nanofilaments of the second plurality of electrically conductive nanofilaments are selected from the group consisting of metal nanowires, semiconductor nanowires, nanofilaments of a metal compound, nanofilaments of a polymer, boron nitride nanotubes and carbon nanotubes.

20. The method of claim 19, wherein allowing the free ends of the second plurality of electrically conductive nanofilaments to enter the loops of the aggregate of the first plurality of electrically conductive nanofilaments comprises allowing non-covalent interaction between the electrically conductive nanofilaments of the first and the second plurality of electrically conductive nanofilaments, thereby joining the first and the second electrically conductive protrusion together.

21. The method of claim 19, wherein the free ends of the carbon nanotubes of the second plurality of carbon nanotubes have a nano hook and wherein contacting the first electrically conductive protrusion with the second electrically conductive protrusion includes allowing the hooks of the second plurality of electrically conductive nanofilaments on the second electrically conductive protrusion to catch the loops of the aggregate of the first plurality of electrically conductive nanofilaments on the first electrically conductive protrusion.

22. A method of forming a wire bond-free conductive interconnect area on a semiconductor substrate, the method comprising:
providing a semiconductor substrate, said semiconductor substrate comprising an electrically conductive protrusion defining a bond pad;
providing a plurality of electrically conductive nanofilaments; and
immobilizing the plurality of electrically conductive nanofilaments on the electrically conductive protrusion forming an aggregate of loops of electrically conductive nanofilaments on the surface of the electrically conductive protrusion according to the method steps of:
(i) depositing the plurality of electrically conductive nanofilaments on the electrically conductive protrusion;
(ii) dispersing said plurality of electrically conductive nonofilaments desposited on said electrically conductive protrusion in a liquid;
(iii) removing a portion of the liquid containing the plurality of electrically conductive nanofilaments, generating a surface tension between the nanofilaments and the remaining liquid;

(iv) deflecting and bending the electrically conductive nanofilaments dispersed in said liquid with said generated surface tension;
(v) forcing a plurality of said electrically conductive nanofilaments to contact the surface of the conductive protrusion with said generated surface tension;
(vi) attaching random portions of the plurality of electrically conductive nanofilaments to the surface of the electrically conductive protrusion through said forced contact, thereby forming a conductive interconnect area on the electrically conductive protrusion without heat treatment.

23. The method according to claim 22 further comprising the method steps of:
providing a plurality of electrically conductive nanofilaments in the form of electrically conductive nanotubes;
immobilizing the plurality of electrically conductive nanotubes on the electrically conductive protrusion on the surface of the electrically conductive protrusion according to the method steps of:
  (i) depositing the plurality of electrically conductive nanotubes on the electrically conductive protrusion;
  (ii) dispersing said plurality of electrically conductive nanotubes deposited on said electrically conductive protrusion in a liquid;
  (iii) removing a portion of the liquid containing the plurality of conductive nanotubes, generating capillary forces on the nanotubes;
  (iv) forcing a plurality of said electrically conductive nanofilaments to contact the surface of the conductive protrusion with said generated capillary forces.

* * * * *